US011369029B2

(12) United States Patent
Luo et al.

(10) Patent No.: US 11,369,029 B2
(45) Date of Patent: Jun. 21, 2022

(54) ROLLABLE DISPLAY DEVICE

(71) Applicant: BOE TECHNOLOGY GROUP CO., LTD., Beijing (CN)

(72) Inventors: Xiaofei Luo, Beijing (CN); Shangchieh Chu, Beijing (CN); Yanyan Yang, Beijing (CN); Baofeng Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/256,161

(22) PCT Filed: Jun. 30, 2020

(86) PCT No.: PCT/CN2020/099333
§ 371 (c)(1),
(2) Date: Dec. 24, 2020

(87) PCT Pub. No.: WO2021/000860
PCT Pub. Date: Jan. 7, 2021

(65) Prior Publication Data
US 2021/0204433 A1     Jul. 1, 2021

(30) Foreign Application Priority Data
Jul. 4, 2019 (CN) .......................... 201910599775.8

(51) Int. Cl.
*H05K 7/02* (2006.01)
*H05K 7/04* (2006.01)
(Continued)

(52) U.S. Cl.
CPC ............. *H05K 5/03* (2013.01); *H05K 5/0017* (2013.01); *H05K 5/0217* (2013.01)

(58) Field of Classification Search
USPC ........................................ 361/807, 809, 810
See application file for complete search history.

(56) References Cited

U.S. PATENT DOCUMENTS 9,760,129 B2    9/2017 Kim et al.
10,186,681 B2 *  1/2019 Kang ..................... H01L 27/32
(Continued)

FOREIGN PATENT DOCUMENTS

CN    106601131 A    4/2017
CN    107316566 A    11/2017
(Continued)

OTHER PUBLICATIONS

International Search Report and Written Opinion issued in PCT/CN2020/099333 dated Sep. 24, 2020 with English translation, (9p).
(Continued)

*Primary Examiner* — Hung S. Bui
(74) *Attorney, Agent, or Firm* — Arch & Lake LLP

(57) ABSTRACT

The present disclosure proposes a rollable display device, including a scroll and a flexible screen. The scroll includes a housing and a rotating shaft, the rotating shaft is rotatably disposed in the housing, and the flexible screen includes a connecting end, the flexible screen is coupled to the rotating shaft through the connecting end, and the flexible screen is configured to be retractably wound on the rotating shaft. The flexible screen includes a cover film and an adhesive frame. The cover film includes a connecting section adjoining the connecting end. The adhesive frame is disposed on a side of the connecting section of the cover film facing the rotating shaft. The connecting section is coupled to the rotating shaft through the adhesive frame, and an orthographic projection of the connecting section on a plane perpendicular to an axial direction of the rotating shaft is arc-shaped or spiral-shaped.

10 Claims, 4 Drawing Sheets

(51) Int. Cl.
*H05K 5/03* (2006.01)
*H05K 5/00* (2006.01)
*H05K 5/02* (2006.01)

(56) References Cited

U.S. PATENT DOCUMENTS

| | | |
|---|---|---|
| 10,264,687 B2 | 4/2019 | Choi et al. |
| 10,466,748 B2 * | 11/2019 | Choi ........................ G09F 9/301 |
| 2016/0363959 A1 | 12/2016 | Rider et al. |
| 2017/0141168 A1 | 5/2017 | Choi |
| 2018/0014415 A1 | 1/2018 | Choi et al. |

FOREIGN PATENT DOCUMENTS

| | | |
|---|---|---|
| CN | 107342018 A | 11/2017 |
| CN | 109179016 A | 1/2019 |
| CN | 109326215 A | 2/2019 |
| CN | 109887419 A | 6/2019 |
| CN | 106601131 B | 9/2019 |
| CN | 110211506 A | 9/2019 |
| CN | 110288914 A | 9/2019 |
| CN | 209591360 U | 11/2019 |
| CN | 109179016 B | 4/2020 |
| JP | H0395075 A | 4/1991 |
| JP | 2014015337 A | 1/2014 |
| JP | 5865330 B2 | 2/2016 |
| KR | 20160059372 A | 5/2016 |
| TW | I680092 B | 12/2019 |

OTHER PUBLICATIONS

First Office Action issued to Chinese Application No. 201910599775.8 dated Nov. 19, 2020 with English translation, (12p).

* cited by examiner

ROLLABLE DISPLAY DEVICE

CROSS-REFERENCE TO RELATED APPLICATION

The present application is the U.S. national phase of PCT Patent Application No. PCT/CN2020/099333 filed Jun. 30, 2020, which claims the priority to the Chinese Patent Application No. 201910599775.8, filed on Jul. 4, 2019, the disclosures of which are incorporated therein by reference in their entireties for all purposes.

TECHNICAL FIELD

The present disclosure relates to the field of flexible display technologies, and in particular to a rollable display device.

BACKGROUND

Existing rollable display devices usually include a scroll and a flexible screen that is retractably wound in the scroll. When the flexible screen is wound on a rotating shaft in the scroll, a stepped structure may occur due to a thickness of the flexible screen at an edge of one end of the flexible screen coupled to the rotating shaft. Such stepped structure may cause stress concentration, which will easily lead to problems of frictional damage to the flexible screen and loose winding.

SUMMARY

The present disclosure adopts the following technical solutions.

According to an aspect of the present disclosure, there is provided a rollable display device, including a scroll and a flexible screen, where the scroll includes a housing and a rotating shaft, the rotating shaft is rotatably disposed in the housing, and the flexible screen includes a connecting end, the flexible screen is coupled to the rotating shaft through the connecting end, and the flexible screen is configured to be retractably wound on the rotating shaft. The flexible screen includes a cover film, a composite film layer and an adhesive frame. The cover film has a connecting section adjoining the connecting end. The adhesive frame is disposed on a side of the connecting section of the cover film facing the rotating shaft. The connecting section is coupled to the rotating shaft through the adhesive frame, and a coupling position where the adhesive frame is coupled to the connecting end is provided with an adhesive layer, and a thickness of the adhesive layer is gradually increasing along a direction away from the connecting end.

According to some embodiments of the present disclosure, as a distance of the adhesive frame relative to the connecting end decreases, a thickness of the adhesive frame gradually decreases.

According to some embodiments of the present disclosure, the adhesive frame has a multi-segment structure, and as distances of individual segments of the adhesive frame relative to the connecting end decrease, thicknesses of the individual segments of the adhesive frame gradually decrease.

According to some embodiments of the present disclosure, as a distance of the adhesive frame relative to the connecting end decreases, a thickness of each segment of the adhesive frame gradually decreases.

According to some embodiments of the present disclosure, an edge of the connecting end is provided with a climbing structure coated with adhesive, and the climbing structure coated with adhesive forms a smooth transition from the connecting end to a surface of the rotating shaft.

According to some embodiments of the present disclosure, as a distance of the adhesive frame relative to the connecting end decreases, a thickness of the adhesive frame at respective positions is the same. The edge of the connecting end is provided with a climbing structure coated with adhesive, and the climbing structure coated with adhesive forms a smooth transition from the connecting end to a surface of the rotating shaft.

According to some embodiments of the present disclosure, the adhesive frame has a multi-segment structure, and as a distance of the adhesive frame relative to the connecting end decreases, a thickness of the each segment of the adhesive frame is the same. The edge of the connecting end is provided with a climbing structure coated with adhesive, and the climbing structure coated with adhesive forms a smooth transition from the connecting end to a surface of the rotating shaft.

According to some embodiments of the present disclosure, the flexible screen further includes a support sheet, the support sheet is disposed on a side of the composite film layer facing the rotating shaft, and the support sheet is made from a magnetic material. An electromagnet is provided inside the scroll, and the electromagnet is configured to, when a function section is wound on the scroll, provide a magnetic field acting on the support sheet so that the function section is fixed by magnetic adsorption.

According to some embodiments of the present disclosure, a cross section of the support sheet in an axial direction of the rotating shaft is in a shape of "⊓".

According to some embodiments of the present disclosure, the flexible screen further includes a support sheet, the support sheet is disposed on a side of the composite film layer facing the rotating shaft, and the support sheet is made from a magnetic material. The rollable display device further includes an under-screen support structure. The under-screen support structure is retractably coupled to the housing, and is configured to support a side of the flexible screen where the support sheet is provided when the flexible screen is extended from the housing. The structure is provided with a magnet, and the magnet is magnetically engaged with the support sheet.

BRIEF DESCRIPTION OF THE DRAWINGS

By considering the following detailed description of preferred embodiments of the present disclosure in conjunction with the accompanying drawings, various objectives, features, and advantages of the present disclosure will become more apparent. The drawings are merely exemplary illustrations of the present disclosure and are not necessarily drawn to scale. In the drawings, the same reference numerals always indicate the same or similar parts. In the drawings.

DETAILED DESCRIPTION

Figure 1:
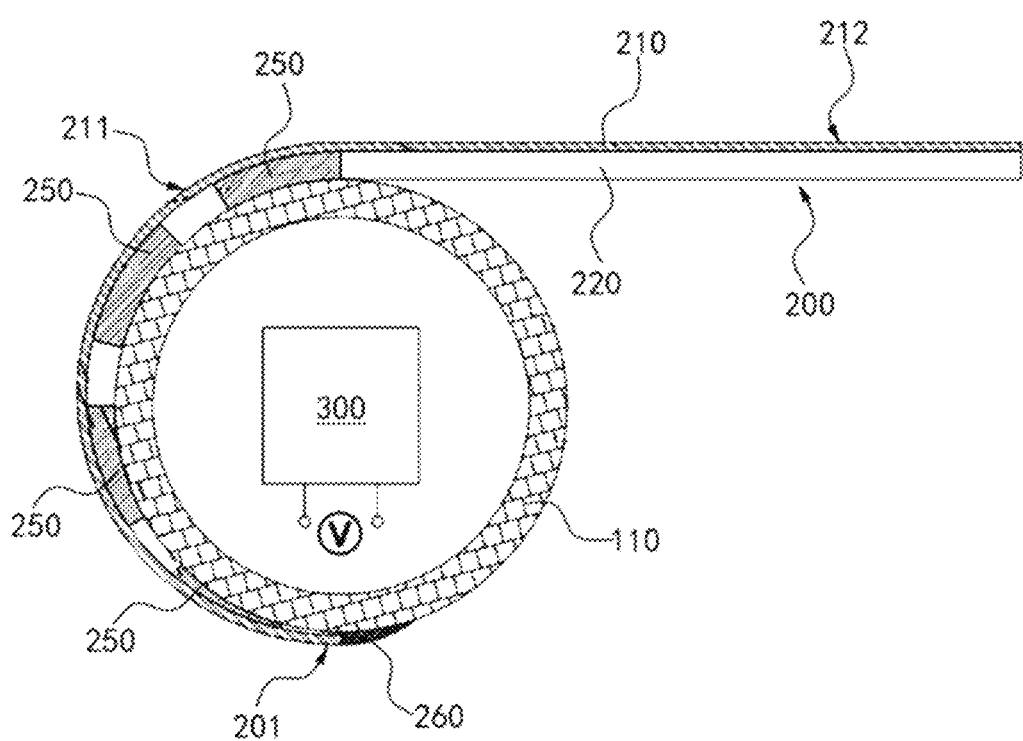
FIG. 1 is a partial cross-sectional view of a rollable display device according to an exemplary embodiment.

Typical embodiments embodying features and advantages of the present disclosure will be described in detail in the following description. It should be understood that the present disclosure can have various changes in different embodiments, which do not depart from the scope of the present disclosure, and the description and drawings therein are essentially for illustrative purposes, rather than limiting the present disclosure.

Different exemplary embodiments of the present disclosure are described below with reference to the accompanying drawings, which form a part of the present disclosure, and in which different exemplary structures, systems and steps that can implement various aspects of the present disclosure are shown by way of example. It should be understood that other specific solutions of components, structures, exemplary devices, systems, and steps can be used, and structural and functional modifications can be made without departing from the scope of the present disclosure. Moreover, although the terms "above", "between", "within", etc. may be used in this specification to describe different exemplary features and elements of the present disclosure, these terms are used herein for convenience only, for example, according to an exemplary direction shown in the drawings. Nothing in this specification should be understood as requiring a specific three-dimensional direction of the structure to fall within the scope of the present disclosure.

FIG. 1 representatively shows a partial cross-sectional view of a rollable display device proposed in the present disclosure, which specifically shows a cross-sectional structure inside the scroll and a structure of parts of a flexible screen 200. It is easily understood by those skilled in the art that, in order to apply the relevant design of the present disclosure to other types of display devices or other processes, various modifications, additions, substitutions, deletions, or other changes are made to the following specific embodiments, and these changes are still within the scope of the principle of the rollable display device proposed in the present disclosure.

Figure 2:
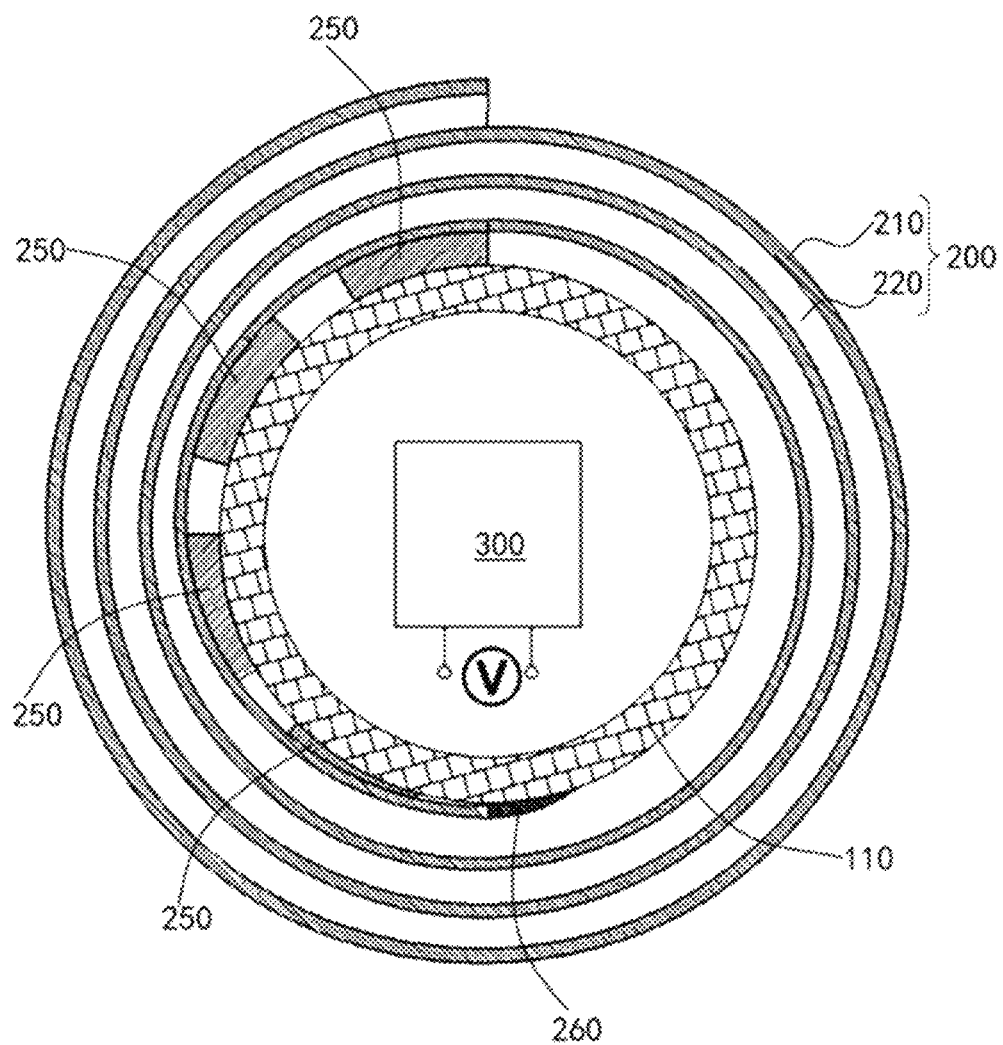
FIG. 2 is another partial cross-sectional view of the rollable display device shown in FIG. 1.
Figure 3:
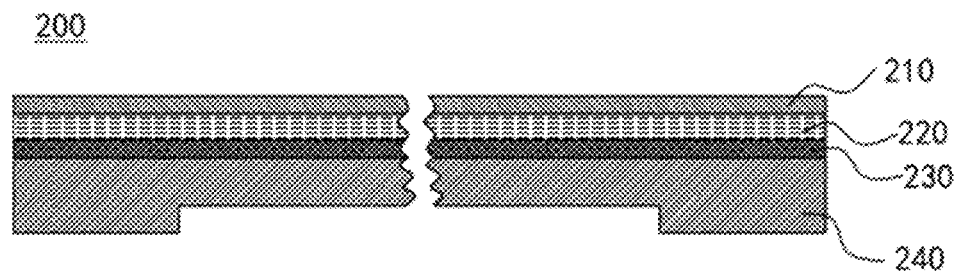
FIG. 3 is a cross-sectional view of a flexible screen of the rollable display device shown in FIG. 1.
Figure 4:
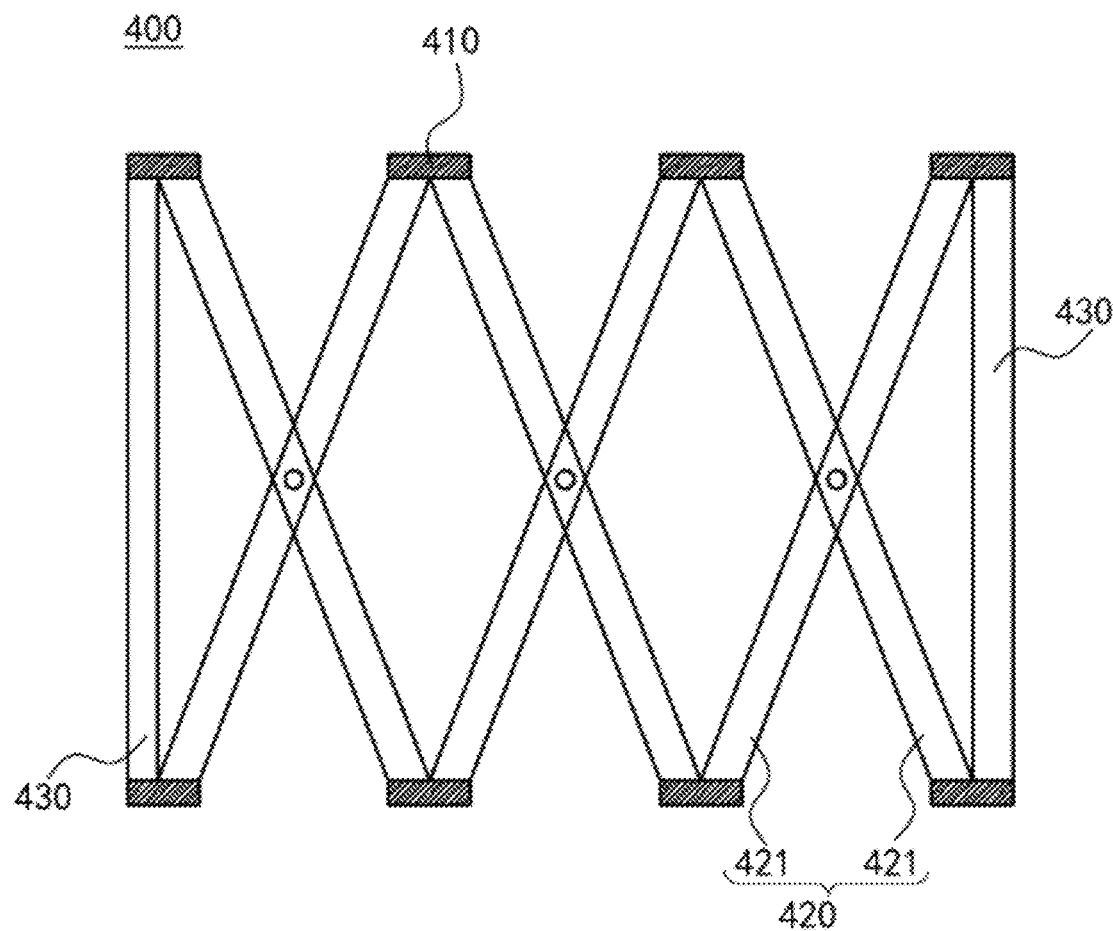
FIG. 4 is a schematic structural diagram of a support structure under the screen of the rollable display device shown in FIG. 1.
Figure 5:
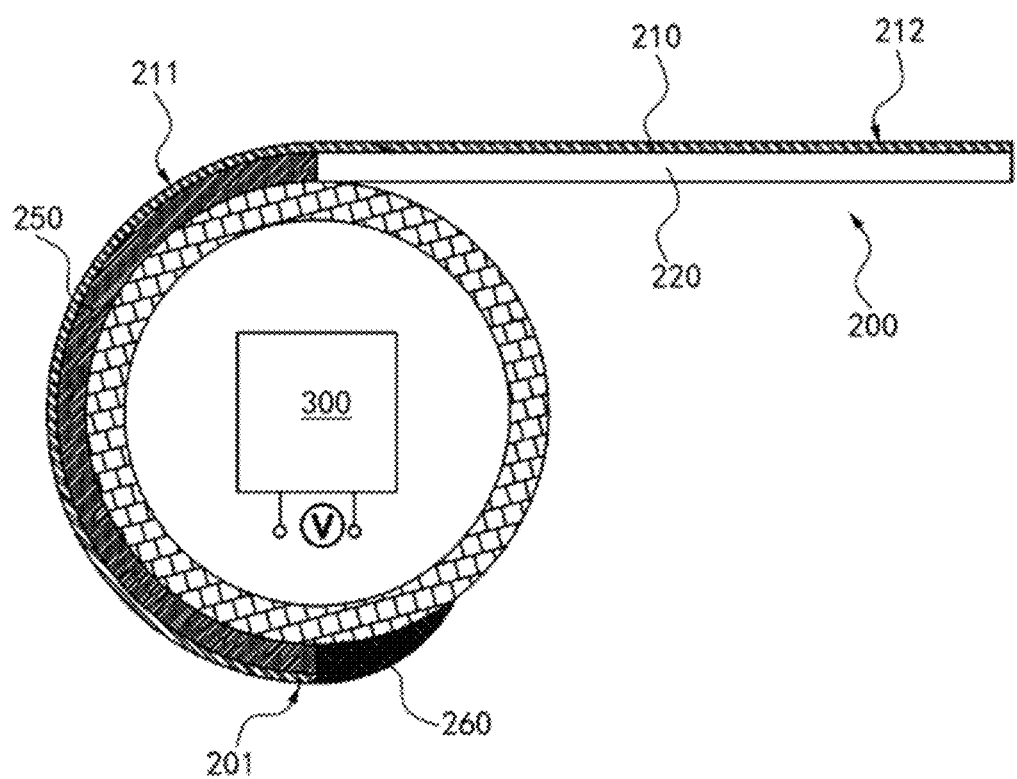
FIG. 5 is a partial cross-sectional view of a rollable display device according to another exemplary embodiment.

As shown in FIG. 1, in this embodiment, the rollable display device proposed in the present disclosure mainly includes a scroll and a flexible screen 200. The scroll mainly includes a housing and a rotating shaft 110. The rotating shaft 110 is rotatably disposed in the housing. The flexible screen 200 has a connecting end 201, through which the flexible screen 200 is coupled to the rotating shaft 110. The flexible screen 200 is retractably wound on the rotating shaft 110. FIG. 2 representatively shows another partial cross-sectional view of a rollable display device, which specifically shows a state in which the flexible screen 200 is wound on the rotating shaft 110. FIG. 3 representatively shows a cross-sectional view of the flexible screen 200. FIG. 4 representatively shows a schematic structural diagram of an under-screen support structure 400; FIG. 5 representatively shows a partial cross-sectional view of a rollable display device in another embodiment in accordance with the principles of the present disclosure. Structures, connection modes and functional relationships of individual main components of the rollable display device proposed in the present disclosure will be described in detail below in conjunction with the above-mentioned drawings.

As shown in FIGS. 1 to 3, in this embodiment, the flexible screen 200 mainly includes a cover film 210, a composite film layer 220 (such as a panel film layer), and an adhesive frame 250 with a multi-segment structure (for example, four segments are shown in the drawings). Specifically, the cover film 210 can be roughly divided into a connecting section 211 and a function section 212. The connecting section 211 of the cover film 210 and the connecting end 201 adjoin, that is, the connecting end 201 of the flexible screen 200 can be understood as an end of the connecting section 211 of the cover film 210. Individual segments of the adhesive frame 250 are disposed at a bottom of the connecting section 211, and are spaced apart from each other in a direction from far to near with respect to the connecting end 201, and the connecting section 211 can be coupled to a surface of the rotating shaft 110 through the adhesive frame 250 with a multi-segment structure. The connecting section 211 of the cover film 210 and the surface of the rotating shaft 110 are spaced through the adhesive frame segments 250, so that the connecting section 211 is approximately a spiral shape. A spiral path of the connecting section 211 is centered on an axis of the rotating shaft 110, and spirally approaches the axis from the end connected to the function section 212 to the connecting end 201. The function section 212 is coupled to an end of the connecting section 211 away from the connecting end 201, and the composite film layer 220 is disposed at the bottom of the function section 212 (the "bottom" is a side surface of the function section 212 facing the rotating shaft 110 when the flexible screen 200 is wounded on the rotating shaft 110, the same applies below). With the above design, a part of the flexible screen 200 (cover film 210) is fixed on the rotating shaft 110 through the adhesive frame 250 with a multi-segment structure, so that an orthographic projection of this part of the flexible screen 200 on a plane perpendicular to an axis of the rotating shaft 110 is in an arc shape or a spiral shape. In this way, after the whole flexible screen 200 is wounded, an influence of the stepped structure between the connecting end 201 and the rotating shaft 110 is reduced. Further, through the design in which individual segments of the adhesive frame 250 are spaced apart from each other, a certain amount of displacement compensation is provided during winding the flexible screen 200, so as to prevent peeling occurred in a fixed area between the flexible screen 200 and the rotating shaft 110 due to excessive force.

Further, as shown in FIG. 1, through the design in which the orthographic projection of the connecting section 211 on the plane perpendicular to the axis of the rotating shaft 110 is substantially in the spiral shape in this embodiment, thicknesses of individual segments of the adhesive frame 250 may preferably gradually decrease as distances from the individual segments to the connecting end 201 gradually decrease. The expression of "gradually decrease" means that thicknesses of different segments of the adhesive frame 250 gradually decrease, and the thickness of each segment of the adhesive frame 250 gradually decreases. Alternatively, it can also mean that thicknesses of different segments of the adhesive frame 250 gradually decrease, and the thickness of each segment of the adhesive frame 250 is constant.

Furthermore, as shown in FIG. 1, based on the design that the thicknesses of individual segments of the adhesive frame 250 gradually decrease, preferably in this embodiment, the thickness of each segment of the adhesive frame 250 at respective positions thereof gradually decreases as the distance between the respective positions and the connecting end 201 gradually decreases. In other embodiments, when the thicknesses of individual segments of the adhesive frame 250 gradually decrease, the thickness of each segment 250 of the adhesive frame at respective positions thereof may also be the same.

Furthermore, as shown in FIG. 1, based on the design in which the thicknesses of individual segments of the adhesive frame 250 gradually decrease and the thickness of each segment of the adhesive frame 250 at respective positions thereof gradually decreases, in this embodiment, for two adjacent segments of the adhesive frame 250, a maximum thickness of the segment close to the connecting end 201 may preferably be less than or equal to a minimum thickness of the other segment far from the connecting end 201.

In other embodiments, the number or structure (for example, thickness relationship) of the segments of the adhesive frame 250 may adopt other designs. For example, as shown in FIG. 5, the adhesive frame 250 may be a one-piece structure, and the adhesive frame 250 is disposed at the bottom of the entire connecting section 211 of the cover film 210.

Further, based on the design that the adhesive frame 250 is the one-piece structure, in this embodiment, the thickness of the one-piece adhesive frame 250 at respective positions thereof may be preferably designed to be gradually decreasing as the distance between the respective positions and the connecting end 201 gradually decreases. In other embodiments, when the adhesive frame 250 is the one-piece structure, the thickness of the one-piece adhesive frame 250 at respective positions thereof may be the same, and in this case, the orthographic projection of the connecting section 211 of the cover film 210 on the plane perpendicular to the axis of the rotating shaft 110 is roughly in the shape of an arc centered on the axis of the rotating shaft 110.

In addition, in other embodiments, when the adhesive frame 250 is designed with a multi-segment structure, the thickness of each segment of the adhesive frame 250 can also be the same. In this case, the orthographic projection of the connecting section 211 of the cover film 210 on the plane perpendicular to the axis of the rotating shaft 110 is roughly in the shape of an arc centered on the axis of the rotating shaft 110.

As shown in FIGS. 1 and 2, in this embodiment, the edge of the connecting end 201 of the flexible screen 200 may preferably be provided with a climbing structure coated with adhesive 260. The climbing structure coated with adhesive 260 smoothly extends from the connecting end 201 to the surface of the rotating shaft 110. The climbing structure coated with adhesive 260 can be formed by coating adhesive between the edge of the connecting end 201 and the surface of the rotating shaft 110. The climbing structure coated with adhesive 260 forms a smooth transition from the connecting end 201 to the surface of the rotating shaft 110, so as to prevent a stepped structure from being occurred at the connecting end 201. With the above design, the present disclosure can completely eliminate the stepped structure between the connecting end 201 and the rotating shaft 110, so that the flexible screen 200 is no longer affected by the stepped structure when it is wound on the rotating shaft 110. The winding stress at the position where the flexible screen 200 is connected to the rotating shaft 110 is reduced.

Continuing, based on the design of the climbing structure coated with adhesive 260, when the adhesive frame 250 (regardless of whether the adhesive frame 250 is the one-piece structure or the multi-segment structure) adopts the design that the thickness is decreasing, the thickness of the adhesive frame 250 at the edge of the connecting end 201 is designed as approaching zero, so that the thickness of the flexible screen 200 at the connecting end 201 is approximately equal to the thickness of the cover film 210. On this basis, the climbing structure coated with adhesive 260 is disposed between the connecting end 201 of the flexible screen 200 and the surface of the rotating shaft 110, which is equivalent to coating the adhesive between the cover film 210 and the surface of the rotating shaft 110. The climbing structure coated with adhesive 260 only needs to smoothly transition over the slight stepped structure formed between the cover film 210 and the surface of the rotating shaft 110.

It should be noted that when the adhesive frame 250 (regardless of whether the adhesive frame 250 is the one-piece structure or the multi-segment structure) adopts other thickness designs, such as the design with the same thickness as described above, the adhesive can also be coated between the connecting end 201 of the flexible screen 200 and the surface of the rotating shaft 110 to form the climbing structure coated with adhesive 260 which is a smooth transition, which is not limited to this embodiment.

Furthermore, as shown in FIG. 3, in this embodiment, the flexible screen 200 may also preferably include a support sheet 240. Specifically, the support sheet 240 is disposed at the bottom of the composite film layer 220, and a material of the support sheet 240 may preferably be a magnetic material. Correspondingly, an electromagnet 300 is preferably disposed in the scroll. When the function section 212 of the flexible screen 200 is wound on the scroll, the electromagnet 300 can be energized, thereby providing an magnetic field acting on the support sheet 240 made of the magnetic material, so that the function section 212 of the flexible screen 200 is fixed through magnetic adsorption, thereby further optimizing the winding effect of the flexible screen 200.

Furthermore, based on the design of the support sheet 240 and the electromagnet 300, in this embodiment, the support sheet 240 may preferably be made of a steel sheet. In other embodiments, other magnetic materials can also be selected for the support sheet 240, which is not limited to this embodiment.

Furthermore, as shown in FIG. 3, based on the design of the support sheet 240 and the electromagnet 300, in this embodiment, a shape of the support sheet 240 in a cross section taken along in the axial direction of the rotating shaft 110 may preferably be in the shape of "⊓". With the above design, when the flexible screen 200 is wound on the rotating shaft 110 and the electromagnet 300 provides the magnetic field to fix the support sheet 240, a contact area between the support sheet 240 and the screen (cover film 210) of the flexible screen 200 wound inside the support sheet 240 is smaller, so as to avoid the wear of the flexible screen 200 by the support sheet 240 in the rewinding state as much as possible. In other embodiments, the support sheet 240 can also adopt other cross-sectional structures, and is not limited to this embodiment.

Furthermore, as shown in FIG. 4, based on the design of the support sheet 240 (regardless that whether or not the electromagnet 300 is provided), in this embodiment, the rollable display device may also preferably include an under-screen support structure 400. Specifically, the under-screen support structure 400 is retractably coupled to the housing, and is used for supporting the bottom of the flexible screen 200 (that is, a side of the flexible screen 200 which is provided with a support sheet 240) when the flexible screen 200 extends from the housing. The support structure may preferably be provided with a magnet 410, and the under-screen support structure 400 can use the magnet 410 to be magnetically engaged with the support sheet 240 of the flexible screen 200, thereby optimizing the supporting effect for the flexible screen 200.

Furthermore, in this embodiment, when the under-screen support structure 400 is unfolded, a position of the magnet 410 may preferably correspond to the two convex structures of the support sheet 240 whose cross-section of the flexible screen 200 is in the shape of "⊓". In other embodiments, the position of the magnet 410 can also be flexibly adjusted, and when the support piece 240 adopts other cross-sectional structures, the position of the magnet 410 can also be adjusted accordingly, which is not limited to this embodiment.

Specifically, as shown in FIG. 4, in this embodiment, the under-screen support structure 400 may preferably adopt a retractable fork frame structure. The fork frame structure has multiple sets of fork frames 420, and each set of fork frames 420 includes two fork arms 421 hinged in the middle, and an end of one of the two fork arms 421 is hinged to an end of one fork arm 421 of the adjacent fork frame 420, the other end is hinged to an end of one fork arm 421 of another adjacent fork frame 420 (one side frame 430 of the fork frame structure), and the other one 421 of the two fork arms 421 is hinged to an end of the other fork arm 421 of the adjacent fork frame 420, the other end is hinged to an end of the other fork arm 421 of another adjacent fork frame 420 (one side frame 430 of the fork frame structure). The magnet 410 can be preferably disposed at the junction of two fork arms 421 of adjacent fork frames 420. In other embodiments, the under-screen support structure 400 can also adopt other designs, and is not limited to this embodiment.

Further, as shown in FIG. 3, in this embodiment, the flexible screen 200 may also preferably include a protective layer 230 (for example, a back film protective layer). Specifically, the protective layer 230 may be disposed between the composite film layer 220 and the support sheet 240.

In this embodiment, the overall module of the flexible screen 200 adopts a thin structure. When the flexible screen 200 is unfolded, it is supported by the support sheet 240, which helps to improve the flatness of the screen (the cover film 210) surface and facilitate the realization of the touch sensor function.

It should be noted here that the rollable display devices shown in the drawings and described in this specification are only a few examples of many types of rollable display devices that can adopt the principles of the present disclosure. It should be clearly understood that the principles of the present disclosure are by no means limited to any details of the rollable display device or any components of the rollable display device shown in the drawings or described in this specification.

In summary, the rollable display device proposed in the present disclosure includes the cover film, the composite film layer and the adhesive frame. The cover film is divided into the connecting section and the function section, and the connecting section adjoins the connecting end. The adhesive frame is disposed at a bottom of the connecting section, the connecting section is coupled to the rotating shaft by the adhesive frame, and the orthographic projection of the connecting section on the plane perpendicular to the axis of the shaft is arc-shaped or spiral-shaped. The function section is coupled to one end of the connecting section away from the connecting end. The composite film layer is disposed at a bottom of the function section. With the above design, the present disclosure uses the adhesive frame to fix a part of the flexible screen (the cover film) on the rotating shaft, so that this part of the flexible screen is in arc shape or spiral shape. In this way, after the whole flexible screen is wounded, an influence of the stepped structure between the connecting end and the rotating shaft is reduced.

The exemplary embodiments of the rollable display device proposed by the present disclosure are described and/or illustrated in detail above. However, the embodiments of the present disclosure are not limited to the specific embodiments described herein, on the contrary, the components and/or steps of each embodiment can be used independently and separately from other components and/or steps described herein. Each component and/or step of one embodiment can also be used in combination with other components and/or steps of other embodiments. When the elements/components described and/or illustrated here are introduced, the terms "one", "a", "the", and "said" are used to indicate that there are one or more elements/components or the like. The terms "include", "contain" and "have" are used to indicate an open meaning of including and means that there may be additional elements/components/etc. in addition to the listed elements/components/etc. In addition, the terms "first" and "second" etc. are used only as markers, and do not limit the number of objects.

Although the rollable display device proposed in the present disclosure has been described according to different specific embodiments, those skilled in the art will recognize that the implementation of the present disclosure can be modified within the spirit and scope of the claims.

What is claimed is:

1. A rollable display device, comprising a scroll and a flexible screen, wherein the scroll comprises a housing and a rotating shaft, the rotating shaft is rotatably disposed in the housing; and the flexible screen comprises a connecting end, the flexible screen is coupled to the rotating shaft through the connecting end, and the flexible screen is configured to be retractably wound on the rotating shaft, wherein the flexible screen comprises:
    a cover film, wherein the cover film comprises a connecting section adjoining the connecting end; and
    an adhesive frame, disposed on a side surface of the connecting section of the cover film facing the rotating shaft;
    wherein the connecting section is coupled to the rotating shaft through the adhesive frame, and a coupling position where the adhesive frame is coupled to the connecting end is provided with an adhesive layer, and a thickness of the adhesive layer is gradually increasing along a direction away from the connecting end, and
    wherein an edge of the connecting end is provided with a climbing structure coated with adhesive, and the climbing structure coated with adhesive forms a smooth transition from the connecting end to a surface of the rotating shaft.

2. The rollable display device according to claim 1, wherein as a distance of the adhesive frame relative to the connecting end decreases, a thickness of the adhesive frame gradually decreases.

3. The rollable display device according to claim 1, wherein the adhesive frame has a multi-segment structure, and thicknesses of individual segments of the adhesive frame gradually decrease as distances of the individual segments of the adhesive frame relative to the connecting end decrease.

4. The rollable display device according to claim 3, wherein a thickness of each segment of the adhesive frame gradually decreases as a distance of the segment of the adhesive frame relative to the connecting end decreases.

5. The rollable display device according to claim 1, wherein as a distance of the adhesive frame relative to the connecting end decreases, a thickness of the adhesive frame at respective positions is the same.

6. The rollable display device according to claim 1, wherein the adhesive frame has a multi-segment structure, and as distances of multiple segments of the adhesive frame relative to the connecting end decrease, thicknesses of the multiple segments of the adhesive frame are the same.

7. The rollable display device according to claim 1, wherein the cover film further comprises a function section, and the function section is coupled to the connecting section; the flexible screen further comprises a composite film layer, wherein the composite film layer is disposed on a side of the function section of the cover film facing the rotating shaft.

8. The rollable display device according to claim 7, wherein the flexible screen further comprises a support sheet, the support sheet is disposed on a side of the composite film layer facing the rotating shaft, and the support sheet is made from a magnetic material; wherein an electromagnet is provided inside the scroll, and the electromagnet is configured to, when the function section is wound on the scroll, provide a magnetic field acting on the support sheet so that the function section is fixed by magnetic adsorption.

9. The rollable display device according to claim 8, wherein a cross section of the support sheet in an axial direction of the rotating shaft is in a shape of "⊓".

10. The rollable display device according to claim 7, wherein the flexible screen further comprises a support sheet, the support sheet is disposed on a side of the composite film layer facing the rotating shaft, and the support sheet is made from a magnetic material; wherein, the rollable display device further comprises:

an under-screen support structure, retractably coupled to the housing, and configured to, when the flexible screen is extended from the housing, support a side surface of the flexible screen where the support sheet is provided, and the support structure is provided with a magnet, and the magnet is magnetically engaged with the support sheet.

\* \* \* \* \*